US006130588A

United States Patent [19]

Gallivan et al.

[11] Patent Number: 6,130,588

[45] Date of Patent: Oct. 10, 2000

[54] DUAL LINE POWER TRANSFORMER

[75] Inventors: James R. Gallivan, Pomona; Kenneth W. Brown, Yacaipa; David R. Sar, Corona, all of Calif.

[73] Assignee: Raytheon Company, Lexington, Mass.

[21] Appl. No.: 09/191,066

[22] Filed: Nov. 12, 1998

[51] Int. Cl.$^7$ .................... H03H 7/38; H03H 7/42

[52] U.S. Cl. .................... 333/25; 333/32

[58] Field of Search .................... 333/25, 32, 119, 333/131; 336/175

[56] References Cited

U.S. PATENT DOCUMENTS

| | | | |
|---|---|---|---|
| 3,273,098 | 9/1966 | Saito | 333/32 X |
| 3,327,220 | 6/1967 | Podell | 336/175 X |
| 5,619,172 | 4/1997 | Reynolds | 333/25 |
| 5,767,754 | 6/1998 | Menna | 333/25 |

*Primary Examiner*—Paul Gensler
*Attorney, Agent, or Firm*—David W. Collins; Andrew J. Rudd; Glenn H. Lenzen, Jr.

[57] ABSTRACT

A high-power wideband transformer (40). The transformer (40) includes a first input terminal (42) connected in parallel to one or more conductor paths (50 and 52) and to a first output conductor (48). A second input terminal (44) is connected in parallel to the one or more conductor paths (50 and 52) and to a second output conductor (54). An inductive device (56, 60, 64, 58, 62, and 66) effects electrical coupling between the one or more conductor paths (50 and 52) and the first output conductor (48) and between the one or more conductor paths (50 and 52) and the second output conductor (54) sufficient to implement a desired transformer ratio from input of the transformer (40) to output of the transformer (40) via approximately colinear wires (56, 60, and 64). In a first illustrative embodiment, the co-linear wires (56, 60, and 64) are parallel wires placed sufficiently close to effect the electrical coupling. The transformer 40 effects a nine-to-one transformer ratio. The one or more conductor paths (50 and 52) include a first conductor path (52) that passes through a first ferrite core (62) and a second ferrite core (58) and include a second conductor path (50) that passes through a third ferrite core (66) and the first ferrite core (62). The first output conductor (48) passes through the third ferrite core (66) parallel to the second conductor path (50). The corresponding co-linear wires (56, 60, and 64) are the second conductor path (50) and the first output conductor (48). The second output conductor (54) passes through the second ferrite core (58) parallel to the first conductor path (52), and the corresponding co-linear wires (56, 60, 64) are the first output conductor (54) and the first conductor path (52). The first ferrite core (62) is disposed between the second ferrite core (58) and the third ferrite core (66) and is shorter than the second ferrite core (58) and the third ferrite core (66).

10 Claims, 2 Drawing Sheets

DUAL LINE POWER TRANSFORMER

BACKGROUND OF THE INVENTION

1. Field of Invention

This invention relates to power transformers. Specifically, the present invention relates to dual line balun transformers used to impedance match a receiver or a transmitter to an accompanying antenna to maximize power transfer.

2. Description of the Related Art

High power transmitters and receivers are used in a variety of demanding applications ranging from communications systems to radar systems. These applications often demand optimum power transfer between the associated transmitters or receivers and accompanying antennas.

Optimum power transfer is particularly important in systems employing high power transmitters over a wide range of bandwidths. In such systems, inefficient power transfer between the transmitters and associated antennas can result in wasted, reflected, and absorbed energy that can contribute to system electrical interference and undesirable heating of associated electronics.

Maximizing the power transfer from the antenna to the transmitter requires impedance matching the transmitter to the antenna.

To accommodate high bandwidth, i.e., wideband transmissions, coaxial baluns are often employed. Coaxial baluns typically include one or more high characteristic impedance coaxial cables to facilitate impedance matching of the transmitter to the accompanying antenna. However, high impedance coaxial cables require thin center conductors, which limits their power handling capability. The high resistivity of the thin center conductors results in excessive heating when employed in moderately high power applications. The excessive heating may result in the melting of electrical components.

Alternatively, conventional windings-based power transformers are often employed to impedance match a transmitter to an accompanying antenna. The transformers typically include a plurality of inductors comprising wire pairs wound around ferrite cores and arranged to achieve a desired input and output impedance required to impedance match the transmitter to the antenna. However, in high power applications, the ferrite cores become excessively hot and are difficult to cool due to their solid nature. In addition, the windings-based power transformers are typically suitable only for low-bandwidth applications due to excessive windings capacitance. When used in high bandwidth applications, the transformers may require additional expensive tuning and coupling circuits. Use of the tuning and coupling circuits force undesirable design constraints on the associated transmission system.

Hence, a need exists in the art for a high power transformer that has a large operating bandwidth.

SUMMARY OF THE INVENTION

The need in the art is addressed by the high-power wideband transformer of the present invention. In the illustrative embodiment, the inventive transformer is adapted for use with a transmitter and an antenna or a receiver and an accompanying antenna. The transformer includes a first input terminal connected in parallel to one or more conductor paths and to a first output conductor. A second input terminal is connected in parallel to the one or more conductor paths and to a second output conductor. An inductive device effects electrical coupling between the one or more conductor paths and the first output conductor and between the one or more conductor paths and the second output conductor sufficient to implement a desired transformer ratio from the input of the transformer to the output of the transformer via approximately co-linear wires corresponding to the one or more conductor paths.

In a first illustrative embodiment, the co-linear wires are parallel wires placed sufficiently close to effect the electrical coupling. The inductive device includes a hollow ferrite cylinder through which run the co-linear wires. The one or more conductor paths includes a single conductor path that passes through a first ferrite core parallel to the second output conductor and through a second ferrite core parallel to the first output conductor to effect a four-to-one transformer ratio. The first conductor path and the second conductor path are copper or silver wires.

In second illustrative embodiment, the transformer effects a nine-to-one transformer ratio. The one or more conductor paths include a first conductor path that passes through a first ferrite core and a second ferrite core and include a second conductor path that passes through a third ferrite core and the first ferrite core. The first output conductor passes through the third ferrite core parallel to the second conductor path. The associated co-linear wires are the second conductor path and the first output conductor. The second output conductor passes through the second ferrite core parallel to the first conductor path, and the corresponding co-linear wires are the first conductor path and the second output conductor. The first ferrite core is disposed between the second ferrite core and the third ferrite core and is shorter than the second ferrite core and the third ferrite core.

To effect a four-to-one transformer ratio, the one or more conductor paths is a single path. To effect a nine-to-one transformer ratio, the one or more conductor paths include two conductor paths. To effect a sixteen-to-one transformer ratio, the one or more conductor paths include four conductor paths.

The novel design of the present invention is facilitated by the use of co-linear wires that provide sufficient electrical coupling and impedance to effect a desired transformer ratio when used in a transformer circuit in place of existing transformer windings or coaxial cables. Use of the co-linear wires with external ferrites provides for easy cooling in high power applications and greatly extends the operable bandwidth of the associated transformers.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
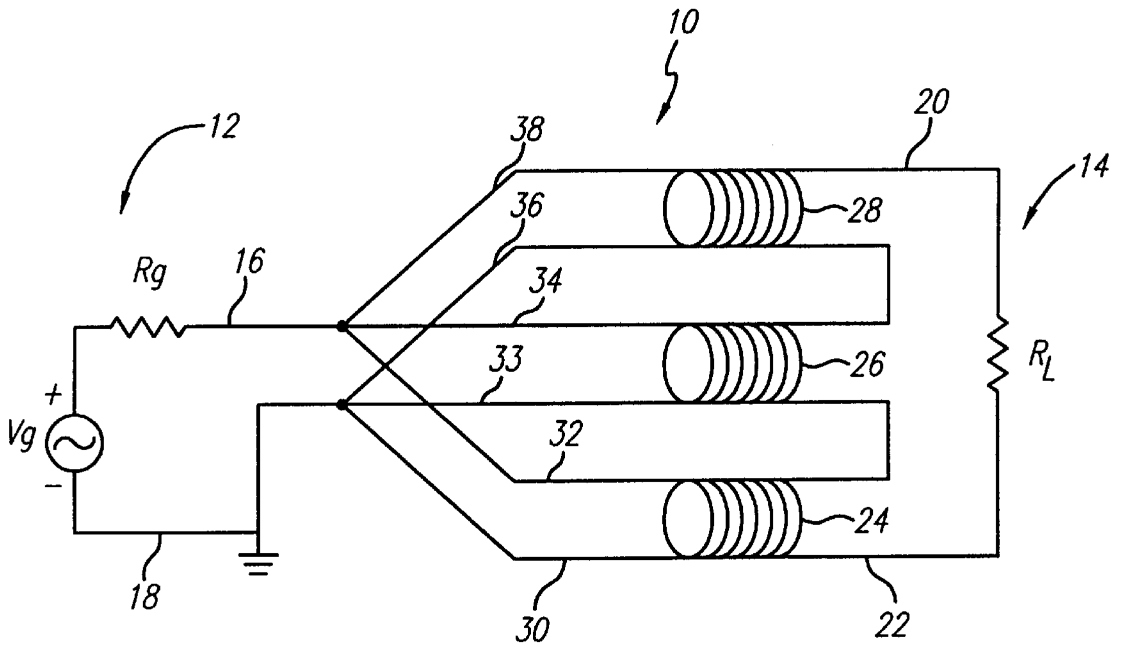
FIG. 1 PRIOR ART
FIG. 1 is a diagram of a conventional nine-to-one windings-base impedance transforming balun.

FIG. 1 is a diagram of a conventional nine-to-one windings-base impedance transforming balun 10. The impedance transforming balun 10 has a nine-to-one transformer ratio and impedance matches an input circuit 12 to an output circuit 14. The input circuit 12 is represented by a voltage source Vg in series with a resistor Rg. A load resistor $R_L$ represents the output circuit. The input circuit 12 is connected to the transforming balun 10 at a first input terminal 16 and at a second input terminal 18. The second input terminal 18 is connected to ground and to a negative terminal of the voltage source Vg. A positive terminal of the voltage source Vg is connected to one end of the resistor Rg, the other end of which is connected to the first input terminal 16. One end of the load resistor $R_L$ is connected to a first output terminal 20. Another end of the resistor $R_L$ is connected to a second output terminal 22.

The transforming balun 10 includes a first transformer core 24, a second transformer core 26, and a third transformer core 28. The first transformer core 24 is wound with a first wire 30 that is connected to the second input terminal 18 and is wound with a second wire 32 that is connected to the first input terminal 16. The second transformer core 26 is wound with a second section 33 of the second wire 32 that is connected to the second input terminal 18 and wound with a fourth wire 34 that is connected to the first input terminal 16. Similarly, the third transformer core 28 is wound with a second section 36 of the fourth wire 34 and is connected to the second input terminal 18 and is wound with a fifth wire 38 that is connected to the first input terminal 16.

The number of windings about the transformer cores 24, 26, and 28, the size of the cores, and the relative separation of the cores is application dependent. The impedance transforming balun 10 effects a nine-to-one transformer ratio. For example, a transmitter represented by the input circuit 12 may have an output impedance of 50 ohms. An antenna represented by the output circuit 14 may have impedance of 450 ohms. The impedance transforming balun 10 steps up the output impedance of the input circuit 12 to match that of the output circuit 14 to effect maximum power transfer between the input circuit 12 and the output circuit 14.

The impedance transforming balun 10, however, has many limitations. The balun 10 has limited bandwidth capability and has a poor low frequency response. In addition, in high power applications, the solid transformer cores 24, 26, and 28 become excessively hot, are difficult to cool, and may result in circuit component melting.

To achieve greater bandwidth handling capability, the wound transformer cores 24, 26, and 28 are often implemented with sections of coaxial waveguides. Transforming baluns implemented in this manner, however, require the maintenance of a logarithmic ratio between impedance and wire size in the coaxial lines. This requirement necessitates very small inner conductors or large and stiff output conductors of the coaxial waveguides. Small inner conductors are undesirable in high-power applications where the high resistance of the thin wires results in excessive wire heating, which increases wire resistance and results in further heating, resulting melting of wire contacts such as solder joints. Large outer conductors are undesirable in many applications such as missile radar systems where small balun size is important.

Figure 2:
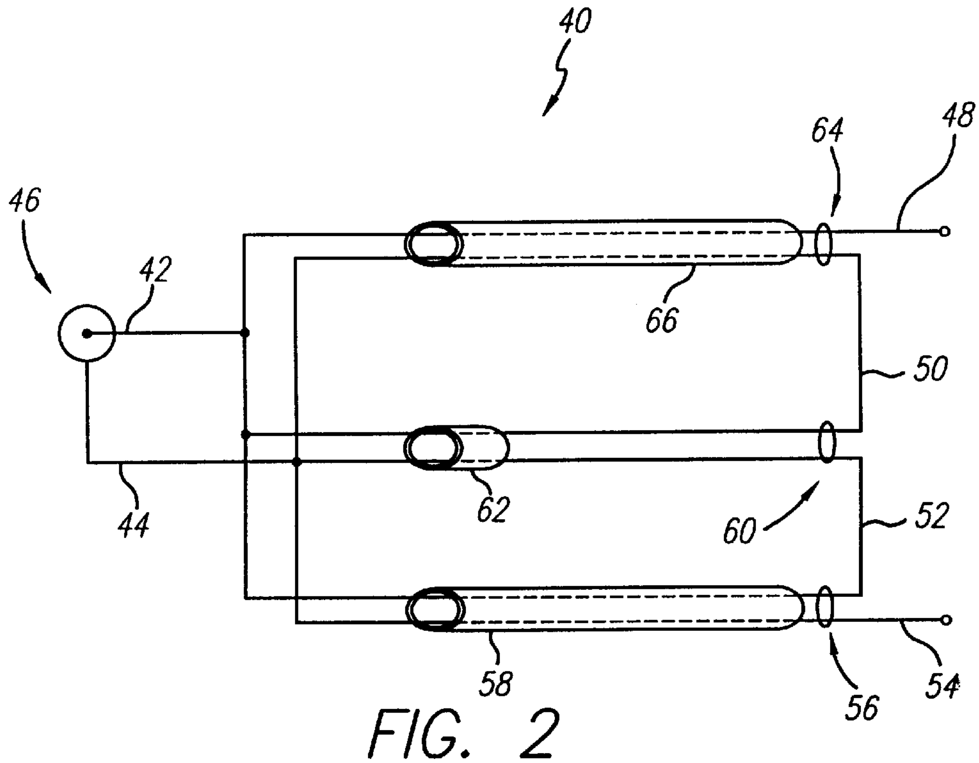
FIG. 2 is a diagram of a nine-to-one impedance transforming balun of the present invention.

FIG. 2 is a diagram of a nine-to-one impedance transforming balun 40 of the present invention. The balun 40 is a nine-to-one impedance transformer. The impedance transformer 40 has a top input terminal 42 and a bottom input terminal 44. For illustrative purposes, the top input terminal 42 is connected to a center conductor of an input coaxial waveguide 46 and the bottom input terminal 44 is connected to an outer conductor of the input coaxial waveguide 46.

The top input terminal 42 is connected in parallel to a top output wire 48, a first electrical path 50 from the top input terminal 42 to the bottom input terminal 44 and a second electrical path 52 from the top input terminal 42 to the bottom input terminal 44. The bottom input terminal 44 is connected in parallel to a bottom output wire 54, to the second electrical path 52, and to the first electrical path 50.

A first portion of the second electrical path 52 runs parallel to the bottom output wire 54 forming a bottom pair of wires 56. The bottom pair of wires 56 runs through a bottom cylindrical ferrite core 58.

A second portion of the second electrical path 52 runs parallel to a first portion the first electrical path 50 forming a center line pair of wires 60. The centerline pair of wires 60 runs through a middle ferrite core 62, which is shorter than the bottom ferrite core 58. An additional low-permeability cylinder (not shown) may be fitted over the rest of the centerline wire pair 60 to aid in convective cooling of the centerline wire pair 60.

A second portion of the first electrical path 50 runs parallel to the top output wire 48 forming a top pair of wires 64. The top pair of wires 64 runs through a top cylindrical ferrite core 66.

The bottom pair of wires 56, the centerline pair of wires 60, and the top pair of wires 64 are electrical devices having characteristic impedances of approximately 150 ohms each. Looking from the input, the pairs 56, 60, and 64 are connected in parallel and provide an input impedance of approximately 50 ohms, which matches the characteristic impedance of the input coaxial waveguide 46. At the output, i.e., looking between the top output wire 48 and the bottom output wire 54, the pairs of wires 56, 60, and 64 are connected in series and provide 450 ohms of output impedance suitable for connection to an antenna (not shown) having 450 ohms of input impedance. In this way, the impedance transformer 40 performs impedance matching to effect maximum power transfer from input to output.

In the present specific embodiment, the electrical paths 50 and 52 and the wires 48 and 54, the top input terminal 42, and the bottom input terminal 44 are implemented with copper conductor transmission lines. The copper transmission lines comprising the wire pairs 56, 60, and 64 are approximately 0.16 inches in diameter, are spaced approximately 0.5 inches apart.

The ferrite cores 58, 62, and 66 are hollow and cylindrical. The ferrite cores 58, 62, and 66 have inner and outer diameters of 1.4 and 2.4 inches, respectively. The bottom ferrite core 58 and top ferrite core 66 are approximately 10 inches in length.

Those skilled in the art will appreciate that the dimensions and compositions of the wire pairs 56, 60, and 64 and the ferrite cores 58, 62, and 66 are application specific and are determined via testing procedures well known in the art.

The ferrite cores 58, 62, and 66 are constructed of ferrimagnetic material having anti-parallel net spins for atoms in the ferrite. The ferrimagnetic material is selected from a class of compounds represented by the chemical formula XO*Fe2O3, where X is a divalent ion such as $CD^{2+}$, $Co^{2+}$, $Fe^{2+}$, $MG^{2+}$, $Ni^{2+}$ or $Zn^{2+}$ or a mixture thereof Because ferrites are oxides, they are typically less dense than metal and have a higher resistivity. As a result, they make effective transformer cores at frequencies beyond the range where eddy-current losses in iron cores are prohibitive.

The wire pairs 56, 60, and 64 are suspended within the ferrite cores 58, 62, and 66 do not touch the ferrite cores. Air within the ferrite cores 58, 62, and 66 acts as a dielectric. The spacing between individual wires, i.e., lines comprising each pair 56, 60, and 64 are optimized for the permeability ($\mu$(H/m)) of the surrounding ferrite to make each line pair impedance 150 ohms.

The shapes of the ferrite cores 58, 62, and 66 facilitate cooling of the associated line pairs 56, 60, and 64 via the use of cooling fans or other means. In addition, the ferrite cores 58, 62, and 66 increase the low frequency impedance of the associated line pairs 56, 60, and 64 to achieve a desirable bandwidth handling ability. The line pairs 56, 60, and 64 and accompanying ferrite cores 58, 62, and 66 can handle large currents and high bandwidth signals.

Transformer heating in high power applications is a significant problem addressed by the present invention. Straight and stiff line pairs 56, 60, and 64 are easily supported at just a few points with high temperature supports such as Teflon (not shown). Air can easily be blown between the ferrite cores 58, 62, and 66 and the middle low-permeability cylinder 62 via cooling fans (not shown) to assist in transformer cooling. The airflow cools both the line pairs 56, 60, and 64 and the ferrite cores 58, 62, and 66.

To allow acceptable power levels in an impedance transformer such as the transformer 40, accompanying copper wires must be either cooled or have relatively large diameters or both. The transformer 40 of the present invention requires less ferrite than comparable transformers, such as the transformer 10 of FIG. 1, that typically employ solid ferrites as transformer cores.

In simulations, the present invention is shown to provide over a factor of three improvement over its coaxial counterpart in power loss at radio and microwave frequencies, and can handle over three times the amount of power. In practice, the present invention was successfully employed in an application where other currently available impedance transforming baluns could not handle the required power.

Those skilled in the art will appreciate that different impedance transforming ratios other than nine-to-one may be implemented using the principles of the present invention, as discussed more fully below, without departing from the scope thereof For example, the impedance transformer 40 may be cascaded or paralleled to achieve a different desired transformer ratio. In addition, those skilled in the art will appreciate that the ferrite cores 58, 62, and 66 may be removed and replaced with another type of material or another shape of material without departing from the scope of the present invention.

Figure 3:
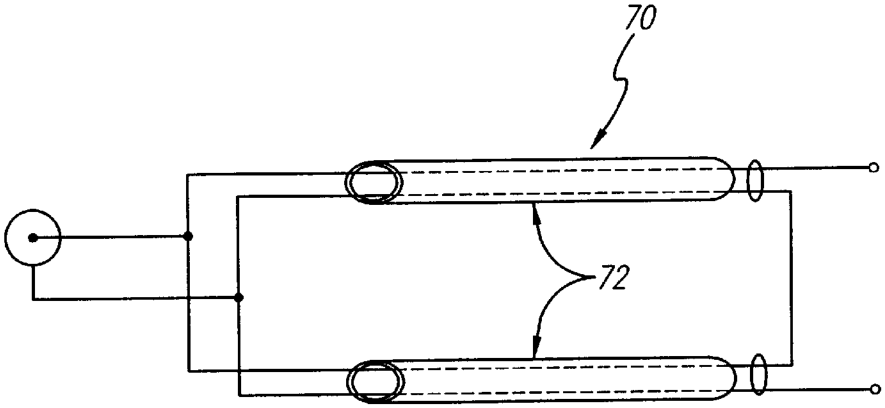
FIG. 3 is a diagram of a four-to-one impedance transforming balun of the present invention.

FIG. 3 is a diagram of a four-to-one impedance transforming balun of the present invention. The operation of the impedance transforming balun 70 of FIG. 3 is similar to the operation of the impedance transforming balun 40 of FIG. 2 with the exception that the impedance transforming balun 70 of FIG. 3 includes inductive devices 72 arranged to achieve a four-to-one transformer ratio. The inductive devices 72 are similar to the cylindrical ferrite cores 58, 62, and 66 with corresponding wire pairs 56, 60, and 64 of FIG. 2.

Figure 4:
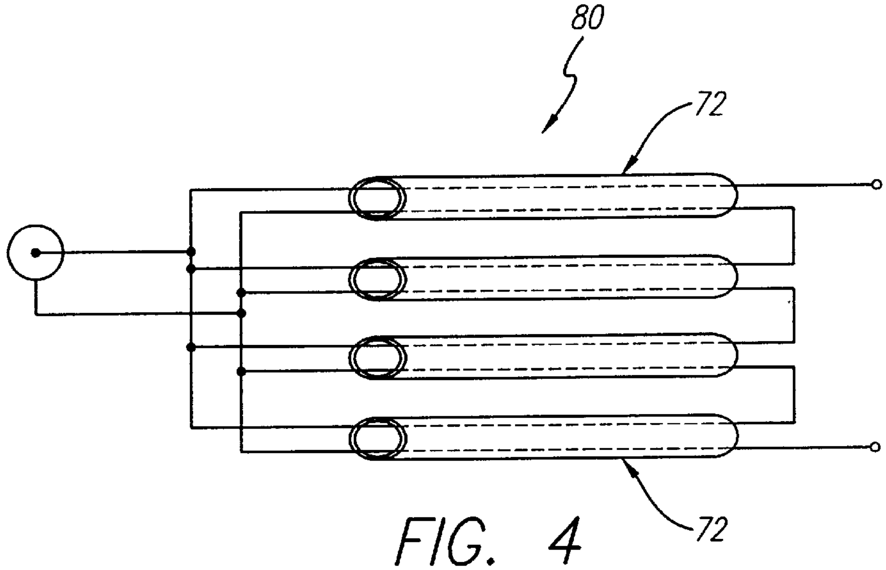
FIG. 4 is a diagram of a sixteen-to-one impedance transforming balun of the present invention.

FIG. 4 is a diagram of a sixteen-to-one impedance transforming balun 80 of the present invention. The operation of the impedance transforming balun 80 of FIG. 4 is similar to the operation of the impedance transforming balun 40 of FIG. 2 with the exception that the impedance transforming balun 80 of FIG. 4 includes the inductive devices 72 arranged to achieve a sixteen-to-one transformer ratio.

Figure 5:
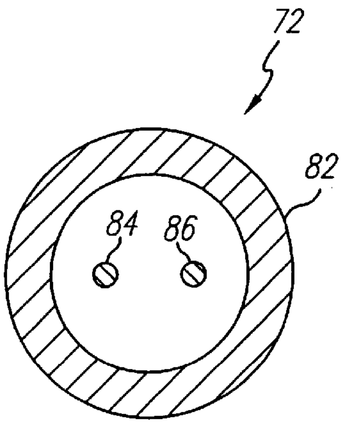
FIG. 5 is a cross sectional view of an inductive device constructed in accordance with the teachings of the present invention.

FIG. 5 is a cross sectional view of the inductive device 72 of FIGS. 3 and 4 constructed in accordance with the teachings of the present invention. A cylindrical ferrite core 82 surrounds a first copper wire 84 and a second copper wire 86, which run parallel to each other and are surrounded by an air dielectric of moving air. The moving air facilitates cooling of the first and second copper wires 84 and 86. To increase the impedance of the copper wires 84 and 86 to a particular frequency, the wires may be bent or coiled to increase the inductance of the copper wires 84 and 86.

Thus, the present invention has been described herein with reference to a particular embodiment for a particular application. Those having ordinary skill in the art and access to the present teachings will recognize additional modifications, applications and embodiments within the scope thereof It is therefore intended by the appended claims to cover any and all such applications, modifications and embodiments within the scope of the present invention.

Accordingly,

What is claimed is:

1. A high-power wideband transformer comprising:

a an input port having a first and a second terminal;

a first set of conductors connected to said first input terminal at least one of said first set of conductors being connected to a first output terminal;

a second set of conductors connected to said second input terminal, at least one of said second set of conductors being connected to a second output terminal;

each of said conductors having an uncoiled linear segment for effecting electromagnetic coupling between said second set of conductors and said conductor connected to said first output terminal and between said first set of conductors and said conductor connected to said second output terminal.

2. The invention of claim 1 wherein said linear segments are parallel wires placed sufficiently close to effect said electrical coupling.

3. The invention of claim 1 including a high-permeability structure at least partially surrounding said approximately co-linear segments.

4. The invention of claim 3 wherein said high-permeability structure includes a hollow ferrite cylinder through which run said co-linear segments.

5. The invention of claim 1 wherein said conductors provide a single conductor path that passes through a first ferrite core parallel to said conductor connected to said second output terminal and through a second ferrite core parallel to said conductor connected to said first output terminal to effect a four-to-one transformer ratio.

6. The invention of claim 1 wherein said conductors provide a first conductor path that passes through a first ferrite core and a second ferrite core and a second conductor path that passes through a third ferrite core and said first ferrite core.

7. The invention of claim 6 wherein said second ferrite core is disposed between said first ferrite core and said third ferrite core and is shorter than said first ferrite core and said third ferrite core.

8. The invention of claim 1 wherein said conductors provide a single path for effecting a four-to-one transformer ratio.

9. The invention of claim 1 wherein said conductors provide two conductor paths for effecting a nine-to-one transformer ratio.

10. The invention of claim 1 wherein said conductors provide four conductor paths for effecting a sixteen-to-one transformer ratio.

* * * * *